United States Patent
Fiedler et al.

(10) Patent No.: US 9,263,221 B2
(45) Date of Patent: *Feb. 16, 2016

(54) LUMINOPHORE AND LIGHT SOURCE CONTAINING SUCH A LUMINOPHORE

(75) Inventors: Tim Fiedler, München (DE); Frank Jermann, Königsbrunn (DE); Jörg Strauss, Augsburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 520 days.

This patent is subject to a terminal disclaimer.

(21) Appl. No.: 13/518,813

(22) PCT Filed: Nov. 24, 2010

(86) PCT No.: PCT/EP2010/068102
§ 371 (c)(1),
(2), (4) Date: Sep. 17, 2012

(87) PCT Pub. No.: WO2011/085849
PCT Pub. Date: Jul. 21, 2011

(65) Prior Publication Data
US 2013/0113364 A1 May 9, 2013

(30) Foreign Application Priority Data
Dec. 22, 2009 (DE) .......................... 10 2009 055 185

(51) Int. Cl.
| | |
|---|---|
| C09K 11/80 | (2006.01) |
| C09K 11/59 | (2006.01) |
| H01J 1/63 | (2006.01) |
| C09K 11/77 | (2006.01) |
| C09K 11/08 | (2006.01) |
| H01L 33/50 | (2010.01) |

(52) U.S. Cl.
CPC ............... *H01J 1/63* (2013.01); *C09K 11/0883* (2013.01); *C09K 11/7734* (2013.01); *C09K 11/7774* (2013.01); *C09K 11/7792* (2013.01); *H01L 33/502* (2013.01); *H01L 2224/32245* (2013.01); *H01L 2224/48091* (2013.01); *H01L 2224/48247* (2013.01); *H01L 2224/73265* (2013.01)

(58) Field of Classification Search
USPC ....... 252/301.4 R, 301.4 F, 301.6 R, 301.6 F; 257/98; 313/503, 486
See application file for complete search history.

(56) References Cited

U.S. PATENT DOCUMENTS

| | | | |
|---|---|---|---|
| 6,657,379 B2 | 12/2003 | Ellens et al. | |
| 6,682,663 B2 | 1/2004 | Botty et al. | |

(Continued)

FOREIGN PATENT DOCUMENTS

| | | |
|---|---|---|
| CN | 1706910 | 12/2005 |
| CN | 101501161 | 8/2009 |

(Continued)

OTHER PUBLICATIONS

Li et al., "Crystal, Electronic Structures and Photoluminescence Properties of Rare-earth Doped LiSi$_2$N$_3$", J. Solid State Chem. vol. 182-2 (2009), p. 301-311.

*Primary Examiner* — Carol M Koslow
(74) *Attorney, Agent, or Firm* — Cozen O'Connor

(57) ABSTRACT

A luminophore from the class of nitridic or oxynitridic luminophores with at least one cation M and an activator D, wherein a proportion x of the cation is replaced with Cu and D is at least one element from the series Eu, Ce, Sm, Yb and Tb

7 Claims, 8 Drawing Sheets

(56) References Cited

U.S. PATENT DOCUMENTS

| | | | |
|---|---|---|---|
| 8,093,798 B2 * | 1/2012 | Becker et al. | 313/503 |
| 8,808,577 B2 * | 8/2014 | Becker et al. | 252/301.4 F |
| 2009/0152575 A1 | 6/2009 | Naum et al. | |

FOREIGN PATENT DOCUMENTS

| | | | |
|---|---|---|---|
| DE | 10 2009 037730 | | 2/2011 |
| EP | 0 155 047 | | 9/1985 |
| EP | 1 433 831 | | 6/2004 |
| EP | 1 696 016 | | 8/2006 |
| JP | 2004-182780 | | 7/2004 |
| JP | 2006-274265 | | 10/2006 |
| WO | WO 2004/030109 | | 4/2004 |
| WO | WO 2006/068360 | | 6/2006 |
| WO | WO 2006/077740 | | 7/2006 |
| WO | WO 2008/015207 | * | 2/2008 |
| WO | WO 2009/016096 | * | 2/2009 |
| WO | WO 2011/020756 | | 2/2011 |

* cited by examiner

LUMINOPHORE AND LIGHT SOURCE CONTAINING SUCH A LUMINOPHORE

RELATED APPLICATIONS

This is a U.S. National Phase Application under 35 USC 371 of International Application PCT/EP2010/068102 filed on Nov. 24, 2010.

This application claims the priority of German Application No. 10 2009 055 185.9 filed Dec. 22, 2009, the entire content of which is hereby incorporated by reference.

FIELD OF THE INVENTION

The invention relates to a luminophore from the class of nitridic or oxynitridic luminophores with at least one cation M and an activator D and a light source containing such a luminophore, in particular a conversion-type LED. Conversion-type LEDs are suitable, in particular, for general lighting.

PRIOR ART

EP 1 696 016 discloses a conversion-type LED which uses a calsin as a red luminophore. The term calsin is used here to mean CaAlSiN nitride.

SUMMARY OF THE INVENTION

It is an object of the present invention to provide a luminophore as described above which enables the properties of nitridic luminophores to be adapted specifically to particular tasks.

According to embodiments of the invention, a novel nitridic or oxynitridic luminophore is provided, for example, a calsin or a nitridosilicate M2Si5N8:Eu. Many such luminophores, particularly nitrides of the type M2Si5N8:D, where D is an activator, suffer significant conversion losses during operation in an LED. Within a short time (typically 1000 hours), such LEDs lose up to 50% of the conversion efficiency. This leads to a marked instability of the color location. White LEDs are becoming ever more important for general lighting. In particular, the demand for warm white LEDs with low color temperatures, good color reproduction and simultaneously high efficiency is increasing. Against the background of the future prohibition of the less energy-efficient general purpose incandescent lamp, alternative light sources with the best possible color reproduction (CRI) are constantly gaining importance. Many consumers place value on luminophores with a spectrum similar to that of an incandescent lamp.

The luminophores must meet a series of requirements: very high resistance to chemical influences, for example, oxygen, to humidity and to interactions with casting materials and also to radiation. In order to ensure a stable color location as the system temperature rises, luminophores which show a very low level of temperature quenching behavior are also required.

Embodiments of the invention include luminophores from the substance groups of nitrides or oxynitrides with improved properties through the introduction of copper ions into the crystal lattice. Cu does not act in this case as a dopant, but as a component of the host lattice.

Cu-modified luminophores of this type are, in particular, luminophores which are doped with Eu alone or in conjunction with other activators, such as: nitridic luminophore systems such as M2-xCuxSi5N8:Eu, where M=(Sr, Ca, Ba), wherein the basic type of luminophore is known from U.S. Pat. No. 6,682,663 and Ca1-xCuxAlSiN3:Eu, wherein the basic type of luminophore is known from EP 169016 and oxynitridic luminophores, such as M1-xCuxSi2N2O2:Eu, where M=(Sr, Ca, Ba), wherein the basic type of luminophore is known from WO 2004/03019, and also alpha-SiAlONs, wherein the basic type of luminophore is known from U.S. Pat. No. 6,657,379. In detail, what is concerned herein is the basic type, to which the formula $M_{p/2}Si_{12-p-q}Al_{p+q}O_qN_{16-q}$:Eu$^{2+}$ belongs, where M=Ca individually or in combination with Sr and Mg, where q is in the range of 0 to 2.5 and p is in the range of 0.5 to 3. Preferably, a higher value is selected for p, specifically in the range of 2 to 3 and a relatively low value for q, specifically in the range of 0 to 1. In place of pure Al, in particular, a mixture of Al, Ga with up to a 20 mol % proportion of Ga.

In general, the proportion of Eu is in the range of 0.2 mol % to 15 mol % of the cation M, in particular 0.5 mol % to 8 mol %. The proportion of Cu in the host lattice is preferably in the range of 0.05 mol % to 5 mol %.

Luminophores of this type are used in white LEDs and color-on-demand LEDs. Many patents describe variations in the luminophore stoichiometry through the introduction of ions that are foreign to the host lattice and the changes in the properties thereby achieved.

The element copper is used as a doping element in the CRT luminophore zinc sulfide. In WO2006/068360, copper is disclosed as a lattice component of oxidic luminophore systems. The introduction of copper into nitridic or oxynitridic luminophores has not previously been reported. Due to the different properties, such as charge, electronegativity and ion radius, of copper ions compared with alkaline earth ions, through the inclusion of Cu ions into the crystal lattice of nitridic or oxynitridic luminophores, the properties of the luminophore can be influenced in a targeted manner. Thus, the position and/or form of the emission band can be influenced by the inclusion of copper and the consequently changed crystal-field splitting. In addition, the efficiency, the absorption properties and the particle morphology can also be amended. As an exemplary embodiment, the short-wave displacement of the emission of the activator europium in CaAlSiN3 can be brought about by the inclusion of copper ions into the lattice.

Preferably, Cu is suitable for inclusion in CaAlSiN nitrides, in particular in Ca(1-x)CuxAlSiN3:Eu2+, wherein the proportion of Cu which replaces Ca is preferably in the range from 0.2 mol % to 5 mol %. Calcium can be partially replaced by Sr and Ba, particularly up to a proportion of 30 mol %. In the case of Sr, the proportion can be up to 90 mol %. The stimulation of such luminophores preferably takes place with short-wave radiation in the UV and short-wave blue regions, in particular in the range from 360 nm to 440 nm.

A luminophore according to an embodiment of the present application is selected from the class of nitridic or oxynitridic luminophores with at least one cation M or Ca, and an activator D, where:

the luminophore has one of the following formulae: $(Ca_{1-z}Sr_z)_{1-x}Cu_xAlSiN_3$:Eu$^{2+}$, $(Ca_{1-y}Ba_y)_{1-x}Cu_xAlSiN_3$:Eu$^{2+}$, $M_{2-x}Cu_xSi_5N_8$:Eu, $M_{1-x}Cu_xSi_2N_2O_2$:Eu, with M being at least one of Sr, Ca, and Ba, with z=0 to 0.9, and y=0 to 0.3, and wherein the luminophore is doped with Eu alone or in conjunction with another activator D, which is at least one element selected from the series Ce, Sm, Yb and Tb, and a proportion x of the cation is replaced with Cu and D, wherein the proportion x of Cu in $(Ca_{1-z}Sr_z)$, $(Ca_{1-y}Ba_y)$, or M lies in the range of 0.05 mol % to 5 mol %, preferably in the range of 0.2 mol % to 5 mol %.

According to yet another embodiment of the present application, a conversion-type LED comprises a chip which emits primary radiation, and a layer containing a luminophore arranged in front of the chip, where the layer converts at least part of the primary radiation of the chip into secondary radiation, the luminophore is a first luminophore as described above according to the present invention, $(Q)_3(T)_5O_{12}$:Ce is used as a further luminophore to produce white, wherein Q is at least one of Lu, Y, and Gd, and T is at least one of Al and Ga.

BRIEF DESCRIPTION OF THE DRAWINGS

The invention will now be described in greater detail by reference to the exemplary embodiments. In the figures.

DETAILED DESCRIPTION OF THE DRAWINGS

Figure 1:
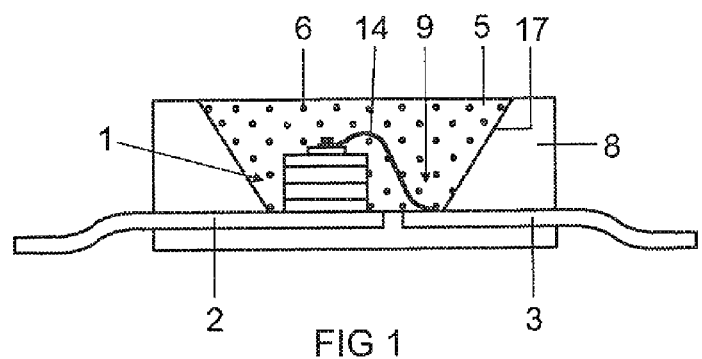
FIG. 1 is a conversion-type LED.

FIG. 1 shows the design of a conversion-type LED for white light based on the known RGB system. The light source is a semiconductor component with a blue-emitting chip 1 of the InGaM type with a peak emission wavelength in the range from 435 nm to 455 nm, for example 445 nm, which is embedded in an opaque basic housing 8 in the region of a recess 9. The chip 1 is connected via a bonding wire 14 to a first terminal 3 and is connected directly to a second terminal 2. The recess 9 is filled with a casting compound 5 which contains, as the main component, a silicone (60% to 90% by weight) and luminophore pigments 6 (approximately 15% to 40% by weight). A first luminophore is a green-emitting garnet luminophore $Lu_3(Al, Ga)_5O_{12}$:Ce(LuAGaG), and as a second luminophore, a red-emitting aluminonitridosilicate Ca0.99Cu0.01AlSiN3:Eu(0.5%). The recess has a wall 17 which serves as a reflector for the primary and secondary radiation from the chip 1 or the pigments 6.

Figure 2:
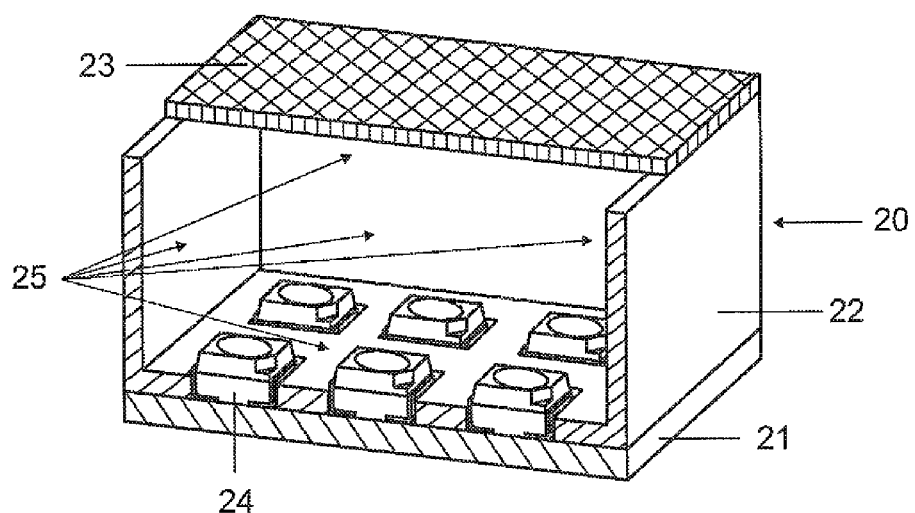
FIG. 2 is an LED module with the applied luminophore mixture removed.

The use of the luminophore mixture as a dispersion, as a thin film, etc., directly on the LED or, as per se known, on a separate support arranged in front of the LED, is essentially possible. FIG. 2 shows such a module 20 with various LEDs 24 on a base plate 21. A housing with side walls 22 and a cover plate 23 is mounted thereabove. The luminophore mixture is applied herein as a layer 25 both on the side walls and, above all, on the cover plate 23, which is transparent. Other suitable light sources are fluorescent lamps or high pressure discharge lamps in which the novel luminophore can be used for converting the primary radiation, alone or in combination with other luminophores.

An example of a modified luminophore of the fundamental structural type 'CaAlSiN3:Eu' is Ca(1-x)CuxAlSiN3:Eu2+ (0.5%).

Figure 3:
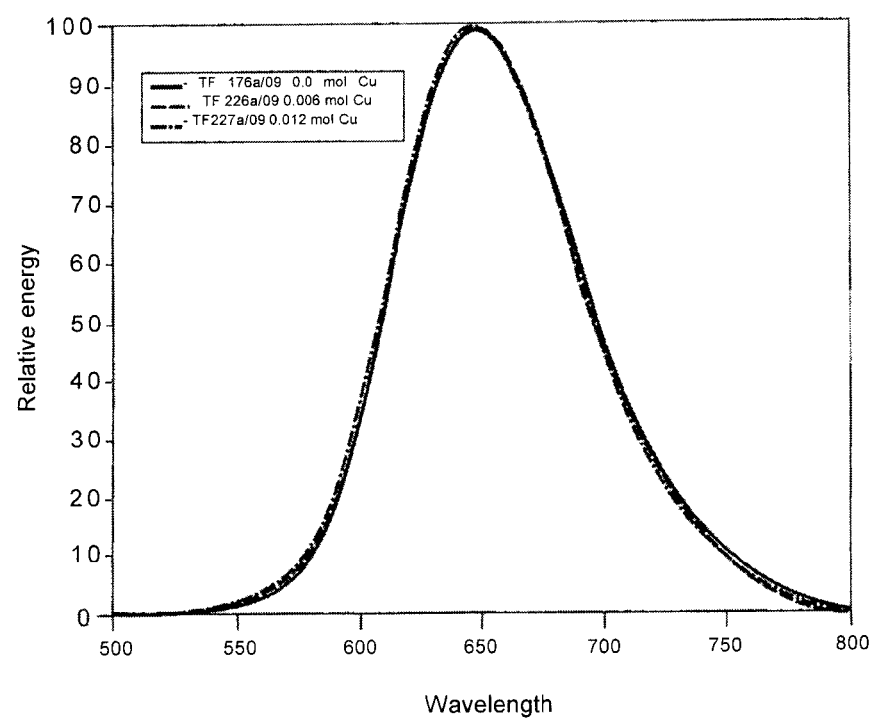
FIG. 3 is a comparison of the emission of luminophores of the type Ca(1-x)CuxAlSiN3:Eu2+(0.5%)

FIG. 3 shows emission spectra of luminophores of the type Ca(1-x)CuxAlSiN3:Eu2+(0.5%) in a Cu concentration series with varying x. x lies in the range of up to 0.012 mol.

It has been found herein that the emission with a low substitution level remains almost unchanged whilst, with a high Cu concentration, the emission is displaced in the short wavelength direction.

Figure 4:
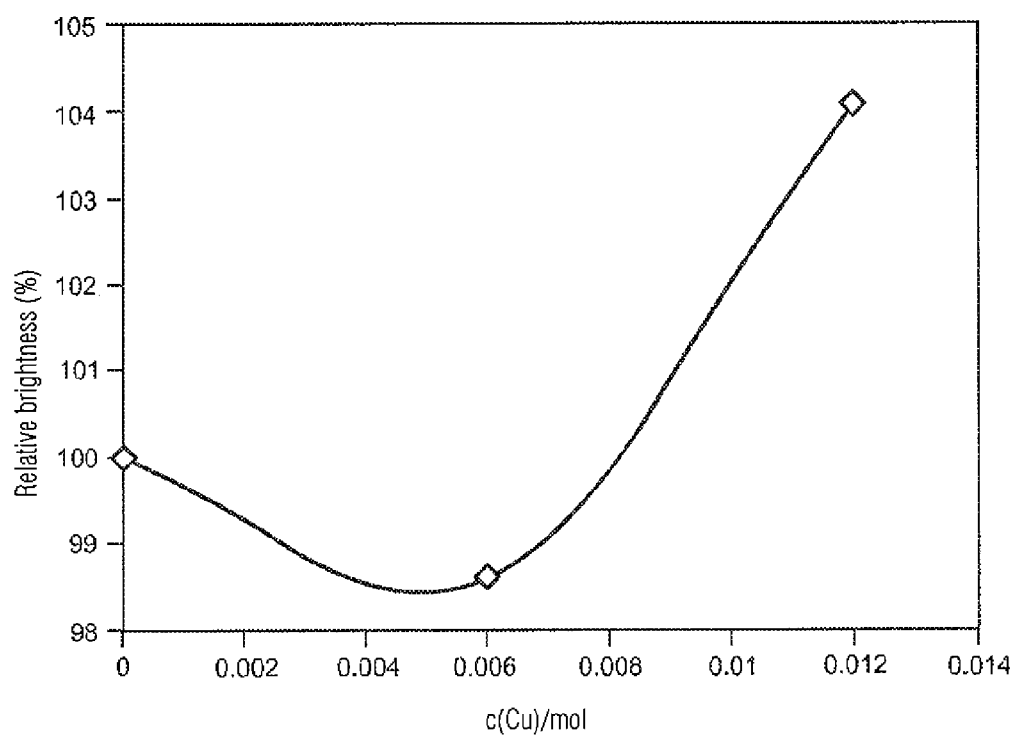
FIG. 4 is a comparison of the brightness of luminophores of the type Ca(1-x)CuxAlSiN3:Eu2+(0.5%)

FIG. 4 shows the improvement in brightness from the inclusion of Cu ions in the calsin Ca(1-x)CuxAlSiN3:Eu2+ (0.5%) in a Cu concentration series with varying x.

With a lower substitution level, the brightness decreases. The brightness increases again unexpectedly at relatively high Cu concentrations.

Figure 5:
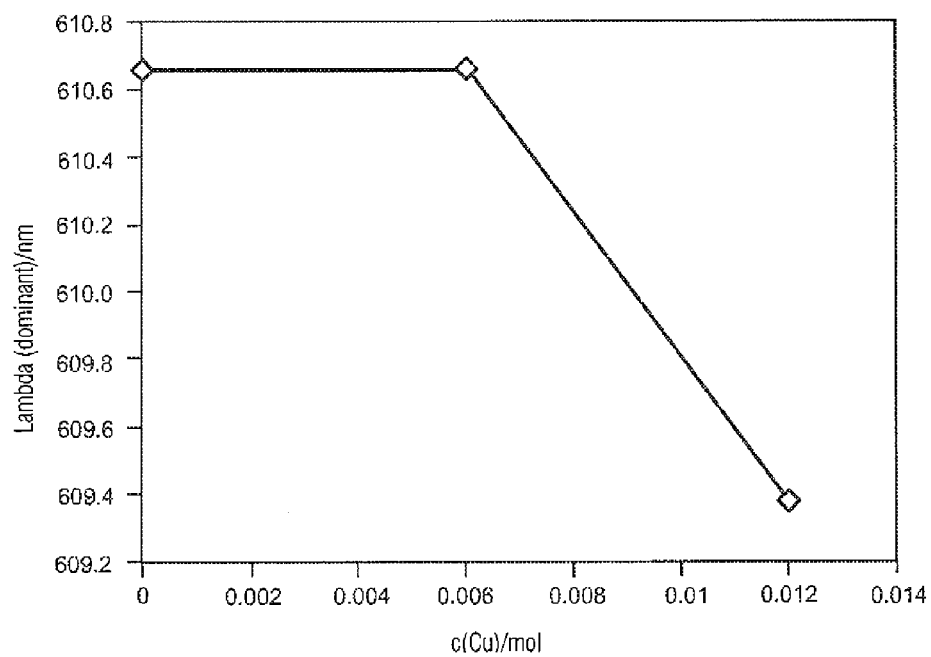
FIG. 5 is a comparison of the change in the dominant wavelength of luminophores of the type Ca(1-x)CuxAlSiN3:Eu2+(0.5%)

FIG. 5 shows the change in the dominant wavelength through the inclusion of copper in Ca(1-x)CuxAlSiN3:Eu2+ (0.5%).

With a low substitution level, the dominant wavelength remains constant. With a higher Cu concentration, the dominant wavelength is displaced in the short wavelength direction.

Figure 6:
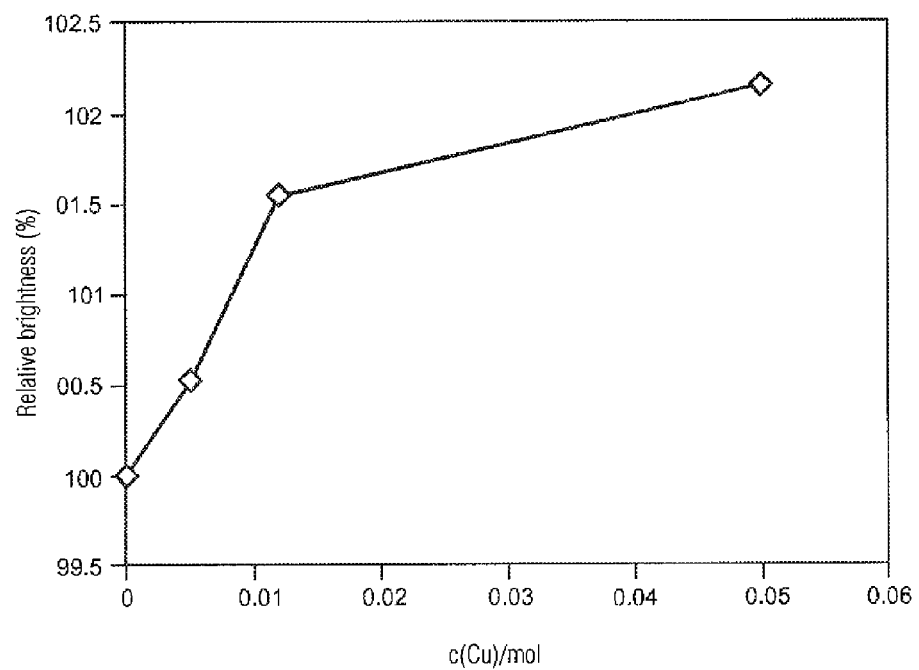
FIG. 6 is a comparison of the change in the relative brightness of luminophores of the type Ca(1-x)CuxAlSiN3:Eu2+(0.5%)

FIG. 6 shows the improvement of brightness due to the inclusion of copper in Ca(1-x)CuxAlSiN3:Eu2+(0.5%) using copper fluoride (CuF2) as the precursor.

As the substitution level increases, the brightness increases. The maximum is very broad and is reached in the range of approximately 4 mol % to 10 mol %, that is, 0.04 mol to 0.1 mol.

Figure 7:
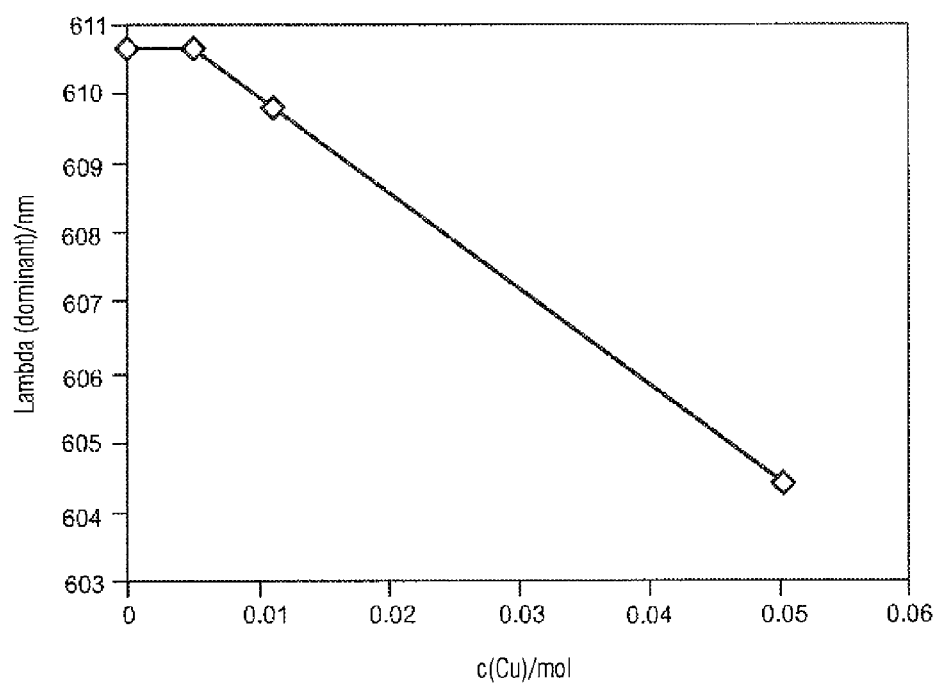
FIG. 7 is a comparison of the change in the dominant wavelength of luminophores of the type Ca(1-x)CuxAlSiN3:Eu2+(0.5%)

FIG. 7 shows the change in the dominant wavelength due to the inclusion of copper in Ca(1-x)CuxAlSiN3:Eu2+(0.5%) using copper fluoride (CuF2) as the precursor.

With a low substitution level, the dominant wavelength remains constant and is displaced in a linear manner in the short wavelength direction at relatively high Cu concentrations, similarly to the use of Cu oxide.

Figure 8:
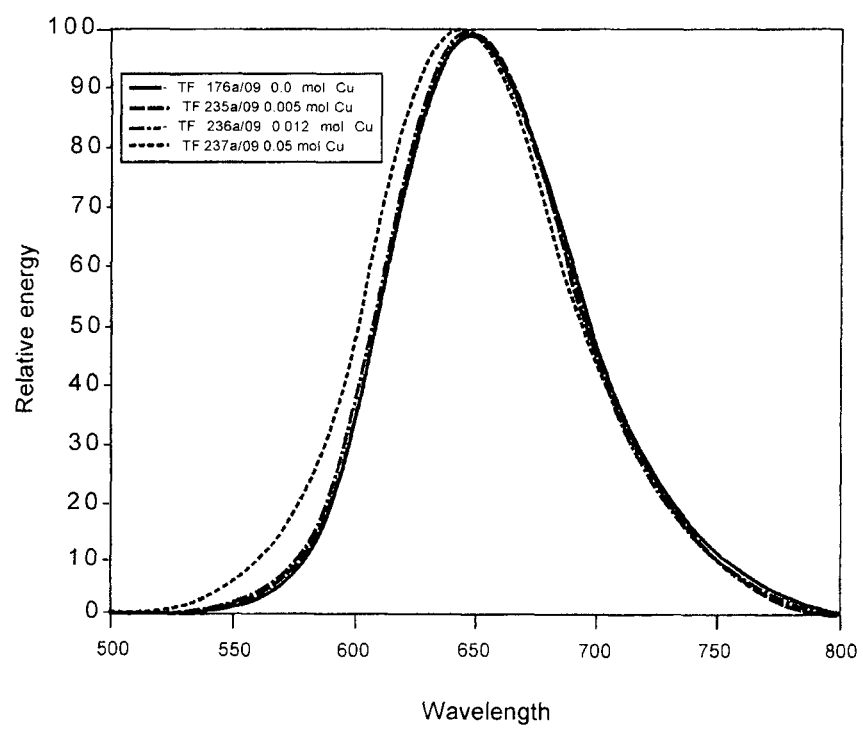
FIG. 8 is a comparison of the emission of luminophores of the type Ca(1-x)CuxAlSiN3:Eu2+(0.5%)

FIG. 8 shows the emission spectra of luminophores Ca(1-x)CuxAlSiN3:Eu2+(0.5%) using copper fluoride (CuF2) as the precursor.

With a low substitution level, the emission remains almost unchanged whilst, with a high Cu concentration, the emission maximum is displaced in the short wavelength direction.

Copper sources that can be used are the halides, nitrides and oxides of copper as well as elemental copper. Preferably, the halides, for example, CuF2, CuCl2 are used, since these compounds are reactive and have the advantage of not introducing any oxygen, which can negatively influence the properties of the luminophore.

Copper ions preferably assume the oxidation number +1 in an (oxy-)nitridic host lattice, as also in copper nitride. In order to achieve a charge-neutral substitution of divalent alkaline earth ions by monovalent copper ions, the substitution of a similar number of alkaline earth ions by trivalent metal ions such as Ce, La, Pr, Y, Nd, Gd, Ho, Sm, Er, Lu, Dy, Tb, Tm, Yb is advantageous. The possibility also exists, for example, in the CaAlSiN and alpha-SiAlON system, of achieving charge neutrality by adjusting the aluminum/silicon ratio. The adjustment can also be made by a nitrogen-oxygen exchange in the lattice.

For the manufacturing of Cu-substituted luminophores, annealing boxes, which minimize the loss of gaseous components, for example, by evaporation of educts, are preferably used. The copper compounds which are highly volatile at the synthesis temperature are thereby retained in the reaction zone. By this means, the synthesis is largely independent of the gas flow in the furnace. A crucible of this type can comprise, for example, a pipe made of molybdenum or tungsten and two cylinders made of aluminum oxide closed at one side, which are pushed over the pipe in tightly sealing manner from both sides. In an actual embodiment of a luminophore Ca(1-x)CuxAlSiN3:Eu2+(0.5%), initially 10.219 g calcium nitride, 10.309 g silicon nitride, 9.036 g aluminum nitride, 0.242 g copper (II) fluoride and 0.194 g europium oxide are weighed out and homogenized. In a glove box, the mixture is placed as a loose fed material into a tube made of molybdenum sheet metal and both ends are tightly sealed, each with a cylinder of aluminum oxide, respectively closed at one side. The heating of the sample takes place in a tubular furnace with a working tube made of aluminum oxide having a diameter in the range of 3 cm to 6 cm. The tube is flushed throughout the heating process with nitrogen at a rate in the range of 0.5 l/min to 3 l/min. The heating up is carried out at approximately 200 K/min to 500 K/min to a plateau temperature in the range of 1550° C. to 1680° C., the dwell time is several hours and cooling takes place similarly rapidly to the heating up. The cooled luminophore is ground in a mortar mill and sieved with a 54 μm sieve screen gauze. The sieved material is again placed in the sealed crucible, heated again using the same temperature profile and is subsequently ground and sieved.

Figure 9:
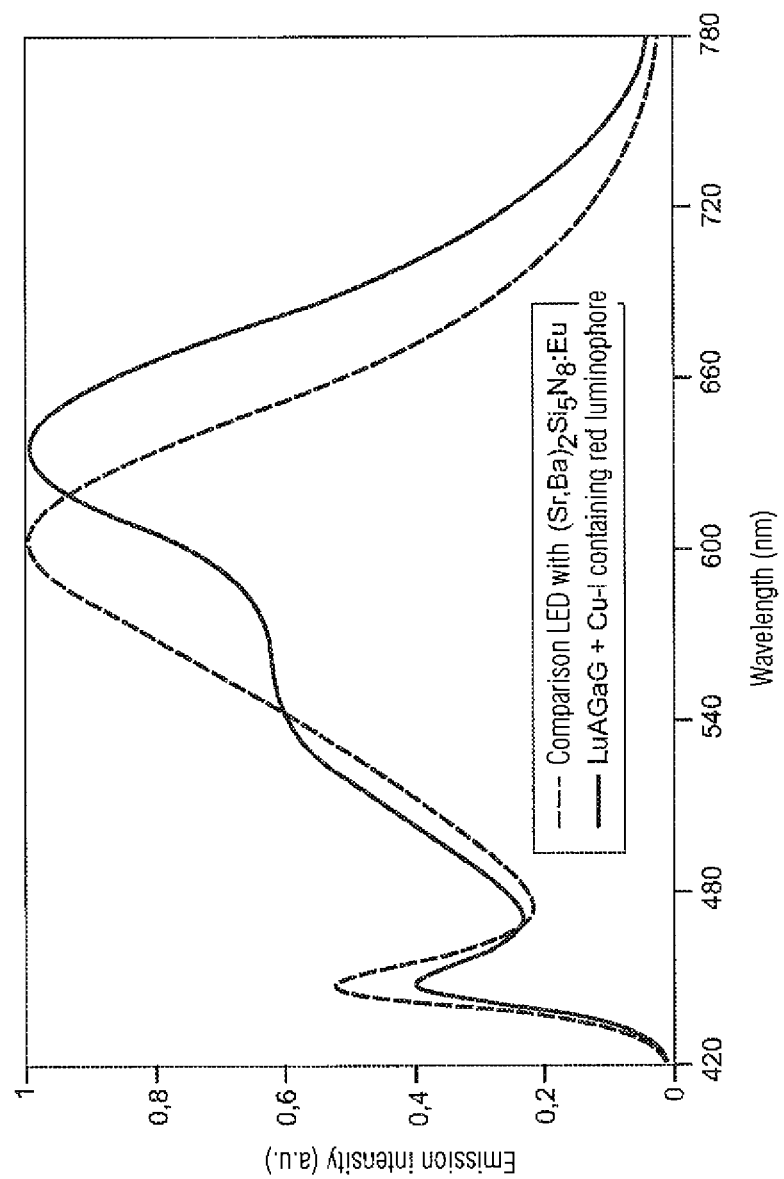
FIG. 9 is a graphical representation of the emission spectrum of a warm white LED on the basis of a novel luminophore compared with a known warm white LED.

FIG. 9 shows the spectrum of a warm white LED based on two luminophores. A first luminophore is $Lu_3(Al_{1-q}Ga_q)_5O_{12}$:Ce, the second is a luminophore according to the invention having the formulation stoichiometry: $(Ca_{1-x}CU_x)AlSiN_{3-2/3x}F_{2x}$:Eu(0.5%), where x=0.012. This formulation stoichiometry does not necessarily and inevitably match the stoichiometry of the compound which is produced during the heating.

From the literature, the compound LiSi2N3 is known and it can be shown that a compound Li1-2x-yCayEuxSi2-yAlyN3 exists and glows yellowish (see J. Solid State Chem., vol. 182-2 (2009), pp. 301-311. However, the luminescence is very broad-banded and is therefore not usable for most applications.

The analogue synthesis of the theoretically conceivable compound CuSi2N3 has, however, not yet been successful. Surprisingly, however, it has been possible with a novel formulation (in particular synthesis via CuF2) to produce highly efficient and narrow-band luminophore compounds of the type CuxCa1-xAl1-xSi1+xN3:Eu2+ (along with other nitrides and oxynitrides). A compound of this type with monovalent Cu, the charge on which is compensated for, for example, by changing the Al/Si ratio is not previously known. Given a small x, the Al/Si ratio must not necessarily be adjusted because the excess Ca and Al—presumably in the form of Ca and AlF3—evaporates off.

Table 1 shows the color reproduction of an LED with a luminophore mixture made from Lu—Ga—Al garnet and the red luminophore according to the invention compared with a mixture with a red luminophore of the class (Sr,Ba)2Si5N8:Eu. Both the Rab value, which takes account of only 8 test colors, as well as the Ra14 value lie significantly above 90. With saturated red, the difference from the prior art is particularly marked.

TABLE 1

| | LED type | |
| --- | --- | --- |
| | Blue LED, peak emission at approximately 440 nm | Blue LED, peak emission at approximately 440 nm |
| First luminophore | LuAGaG:Ce | LuAGaG:Ce |
| Second luminophore | (Sr,Ba)2Si5N8:Eu | (Ca1-xCux)AlSiN3-2/3xF2x:Eu(0.5%) where x = 0.012 |
| Ra(8) | 83 | 96 |
| Ra14 | 77 | 95 |
| R9 (saturated red) | 12 | 92 |

The invention claimed is:

1. A luminophore from the class of nitridic or oxynitridic luminophores with at least one cation M or Ca and an activator D, wherein the luminophore has one of the following formula:

$(Ca_{1-z}Sr_z)_{1-x}Cu_xAlSiN_3$:D, $(Ca_{1-y}Ba_y)_{1-x}Cu_xAlSiN_3$:D, $M_{2-x}Cu_xSi_5N_8$:D, $M_{1-x}Cu_xSi_2N_2O_2$:D with M being at least one of Sr, Ca, Ba, with z=06-0.9 and y =0-0.3 and with D being Eu alone or in conjunction with another activator which is at least one element from the series Ce, Sm, Yb and Tb, and a proportion x of the cation is replaced with Cu and D wherein the proportion x of Cu in $(Ca_{1-z}Sr_z)$, $(Ca_{1-y}Ba_y)$ or M lies in the range of 0.05 mol % to 5 mol %.

2. The luminophore as claimed in claim 1, wherein the proportion of the activator D lies in the range of 0.2 mol % to 15 mol %.

3. The luminophore as claimed in claim 1, wherein the proportion of Cu in $(Ca_{1-z}Sr_z)$, $(Ca_{1-y}Ba_y)$ or M lies in the range of 0.2 mol % to 5 mol %.

4. A light source comprising a luminophore as claimed in claim 1.

5. The light source as claimed in claim 4, wherein the light source is a conversion-type LED, a fluorescent lamp or a high pressure discharge lamp.

6. A conversion-type LED having a chip which emits primary radiation, and a layer containing a luminophore arranged in front of the chip, said layer converting at least part of the primary radiation of the chip into secondary radiation, wherein said luminophore is a first luminophore as claimed in claim 1.

7. The conversion-type LED as claimed in claim 6, wherein $(Q)_3(T)_5O_{12}$:Ce is used as a further luminophore to produce white, wherein Q is at least one of Lu, Y, and Gd and T is at least one of Al and Ga,.

* * * * *